(12) United States Patent
Colby

(10) Patent No.: US 6,591,205 B1
(45) Date of Patent: Jul. 8, 2003

(54) PSEUDO ARBITRARY WAVEFORM GENERATOR

(75) Inventor: David D. Colby, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/426,227

(22) Filed: Oct. 22, 1999

Related U.S. Application Data

(60) Provisional application No. 60/105,267, filed on Oct. 22, 1998.

(51) Int. Cl.[7] .............................................. G06F 19/00
(52) U.S. Cl. ......................................... 702/66; 708/274
(58) Field of Search ............................ 702/66, 67, 70, 702/73, 124; 341/120, 145, 147, 153, 144, 154, 133, 136, 138, 156; 327/105, 126; 324/73.1, 144, 765; 708/274

(56) References Cited

U.S. PATENT DOCUMENTS

| | | | |
|---|---|---|---|
| 3,778,814 A | * 12/1973 | Dildy, Jr. .................... 340/347 |
| 4,222,108 A | * 9/1980 | Braaten ....................... 364/608 |
| 4,447,747 A | * 5/1984 | LaPotin ....................... 307/529 |
| 5,463,334 A | * 10/1995 | Griffin et al. ................ 327/106 |

* cited by examiner

Primary Examiner—Marc S. Hoff
Assistant Examiner—Mohamed Charioui
(74) Attorney, Agent, or Firm—Michael K. Skrebot; Wade James Brady, III; Frederick J. Telecky, Jr.

(57) ABSTRACT

A method of waveform generation using a VLSI digital tester unit without an arbitrary waveform generator. A software application produces a series of vectors to drive a digital tester unit from a set of datapoints which defines a waveform needed in the test program. The set of datapoints can be generated in a test simulator such as SPICE or can be generated by digitizing the arbitrary waveform needed in a test program. The vectors describe the number of resistors of a pseudo arbitrary waveform generator (PAWG) circuit to be driven high in order to reproduce the desired waveform for input into the device under test. The software also determines the resolution, e.g., 5 ns, of the waveform.

20 Claims, 3 Drawing Sheets

PSEUDO ARBITRARY WAVEFORM GENERATOR

This application claims priority under 35 USC§119(e)(1) of provisional application No. 60/105,267 filed Oct. 22, 1998.

BACKGROUND AND SUMMARY OF THE INVENTION

The present invention relates to the field of electronic design and testing, and specifically to the field of generation of analog test signals for device testing.

Background: Linear and Mixed-Signal Devices

Mixed-signal devices require synchronized analog and digital signals to be sourced to the Device-Under-Test ("DUT") for comprehensive test coverage. Linear DUTs also require analog signals to be sourced as input for complete test coverage. These mixed analog and digital signals are known as test stimuli. Both types of devices require input waveforms which are extremely difficult to generate. The problem is increasingly difficult when attempting to test such devices with a VLSI digital tester.

The analog signal and mixed signal (digital patterns that work in combination with analog signals) portions of test programs are typically generated by a test engineer. The test engineer uses mostly manual processes to create and measure sine waves, current, DC voltages, and digital patterns to exercise the analog and mixed-signal portions of the DUT. Consequently, generation of analog and mixed-signal test programs is still a laborious and manual process.

Background: Arbitrary Waveform Generators

The traditional solution to generating the waveforms needed to fit the analog portion of a test program is to add an expensive Arbitrary Waveform Generator (or "AWG"), such as the HP E1441A by Hewlett Packard, to a digital tester unit. Typically, an AWG such as the HP E1441A can output standard waveforms: sine, square, triangle, ramp, and noise. The AWG also allows custom design of waveforms. Any waveform generated can be modulated using AM, FM, FSK, or other forms of modulation. Frequency sweeping is also typically available. The number of datapoints defined in the waveform (or "the resolution of the waveform") is also subject to user control in the AWG.

FIG. 2 depicts the connection of a digital tester unit to both an AWG and a DUT. The VLSI Digital Tester initiates and controls the generation of waveforms needed to test the DUT. Communication of the VLSI Digital Tester unit with the DUT depends upon the design of the DUT. Generally, an electronic interconnection, such as Testhead 102 is constructed as the interface between the output pins of the VLSI Digital Tester unit and the input pins of the DUT. The interface can include additional hardware which further modifies the output of the digital tester unit. A device interface board 104 is used to connect the Testhead 102 to the DUT. The Tester Control Computer controls both the AWG and the VLSI Digital Tester while a test program is administered. The AWG must also be in communication with the VLSI digital tester unit. The VLSI digital Tester and the AWG are connected in order to synchronize the output of the AWG (input to the DUT) with the VLSI Digital Tester. As FIG. 2 reveals, one source of problems for the test engineer in utilizing an AWG is cabling. When setting up a test of a device type that uses AWG output, the test engineer must install cables to the Testhead, the VLSI Digital Tester, and the Tester Control Computer. When a device type that does not use the AWG is setup for testing, the cables must be removed.

Aside from interface issues, another disadvantage of using an AWG is cost. The cost of an AWG usually depends on the resolution of the waveform (or the number of samples per second) which it can process. The rise in costs of AWGs is often disproportional to the resolution of the waveform generated. The result can be a digital tester/AWG combination with a 1998 price tag of $1 million connected to a DUT priced at $2.

Pseudo Arbitrary Waveform Generator

The present application discloses a method which allows an inexpensive circuit of resistors and capacitors to convert the output of digital tester drivers to a finite range of arbitrary waveforms. The generation of arbitrary waveforms takes place without an AWG.

A software application receives a set of datapoints which defines a waveform needed in the test program. The set of datapoints can be generated in a test simulator such as SPICE or can be generated by digitizing the arbitrary waveform needed in the test program. The software, based on the set of datapoints, determines how many resistors of a pseudo arbitrary waveform generator (PAWG) circuit need to be driven high in order to reproduce the waveform for input into the DUT. The software also determines the resolution, e.g., 5 ns, of the waveform. Once these calculations are complete, a set of digital vectors is created which describes to the VLSI digital tester how and when to drive the resistors. The vector set generated must be in a language accepted by the target VLSI tester.

As the vector set is processed, the resistors of the PAWG circuit cause the voltage at the output of the circuit to modulate. A capacitor connected to the resistors smooths the modulation creating a waveform substantially similar to that described by the set of datapoints. The output of the circuit (the test stimulus) is then applied to the DUT.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Pseudo Arbitrary Waveform Generator Software

In the presently preferred embodiment, the generation of pseudo-arbitrary waveforms is accomplished using a software application, a vector set, a VLSI digital tester, and a discrete time to continuous time conversion circuit. Many different digital testers are currently available. For example, V-series or Polaris testers can be acquired and used with the pseudo arbitrary waveform generator (or "PAWG") described. From the perspective of the PAWG, the digital testers differ only in the vector set required to properly drive the resistor divider of the PAWG circuit.

A VLSI digital tester typically has a pattern generator which will take fixed data and apply new data at an accurately fixed rate, such as every 5 ns. At such a rate, logic data supplied to any of inputs $R_1$–$R_n$ (the resistors of the resistor divider of the PAWG circuit) are capable of changing from a preprogrammed high voltage e.g., 1 in the presently preferred embodiment, to a preprogrammed low voltage e.g., −1 in the presently preferred embodiment (or vice versa) every 5 ns. The PAWG results in simplified generation of analog test stimuli, including unusually shaped waveforms, with relatively few components and at a reduced cost.

A software application is used to create the vector set. Prior knowledge of the digital tester which will be used in the PAWG process is needed so that an accurate vector set can be generated. The software code used to generate all information needed to produce the vector set is generic. Only the vector set routine must be altered for each VLSI digital tester.

Figure 3A:
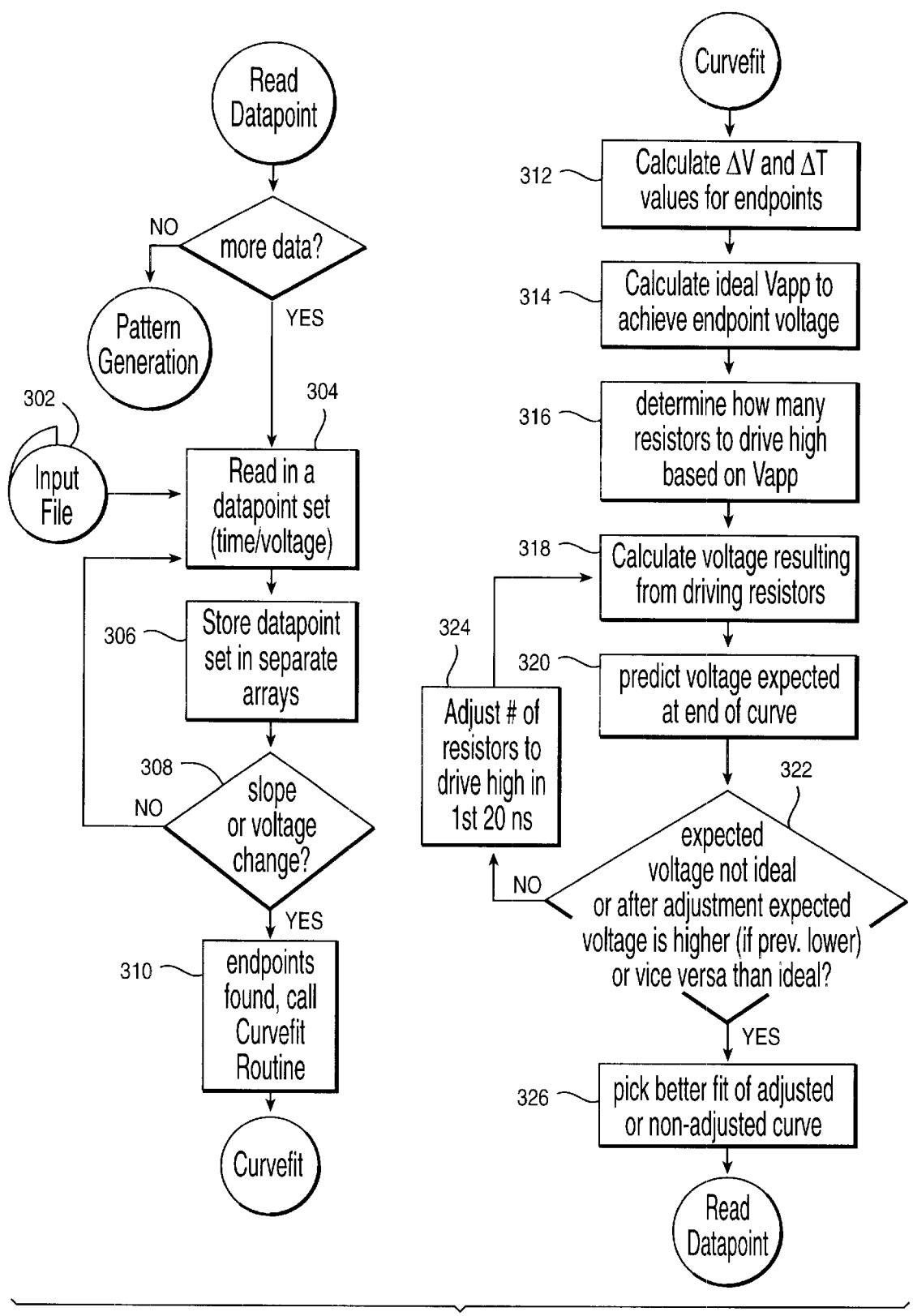
FIGS. 3A and 3B are a flowchart of the PAWG.
Figure 3B:
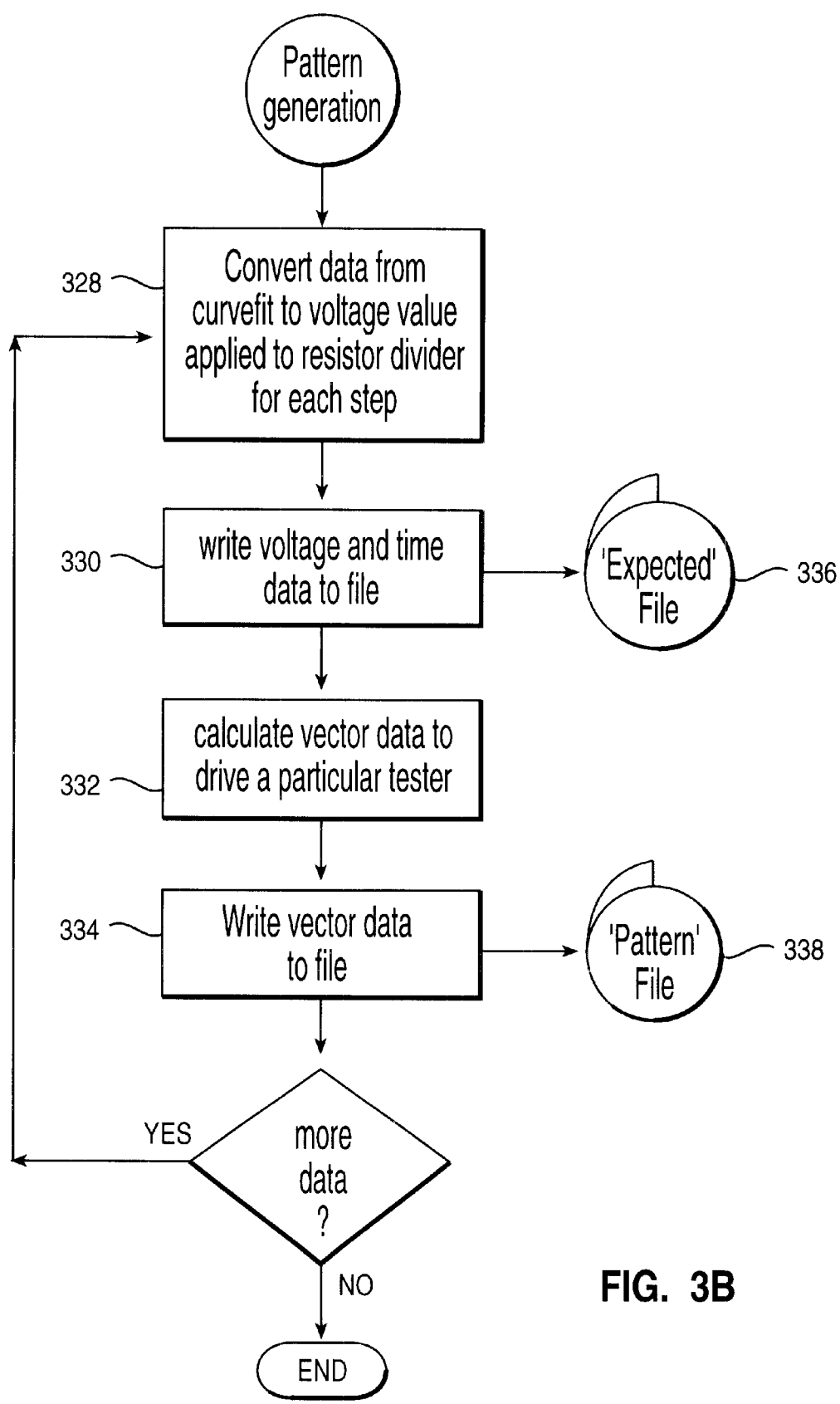

FIGS. 3A and 3B are a flowchart of the PAWG software. In the presently preferred embodiment, the PAWG software reads a file of time/voltage pairs 302 which define a waveform in discrete time intervals (Step 304). A simulator, e.g., SPICE or a digitized waveform, can be used to produce such a file. In an actual test case, an analog waveform can be generated, digitized, and then used in a test program. As the datapoint (time/voltage pair) is read, it is stored in a pair of arrays (time and voltage) (Step 306).

Figure 1:
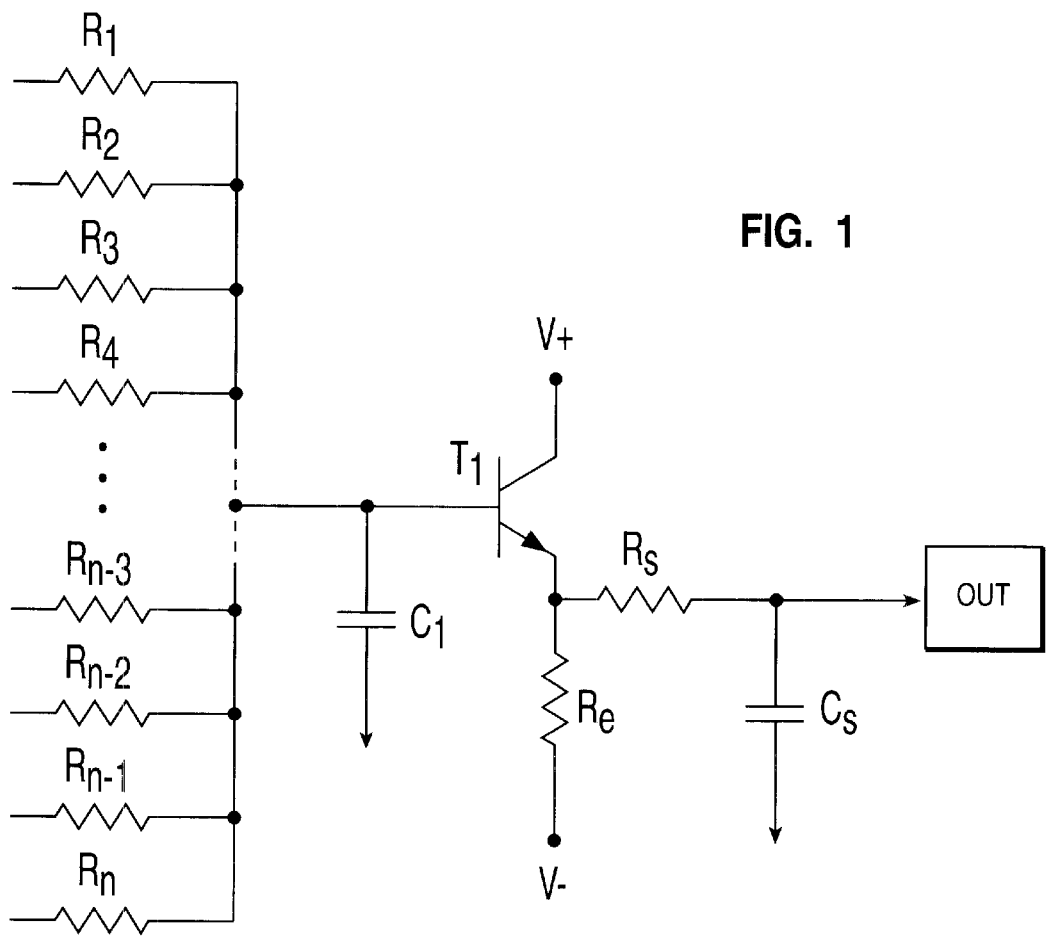
FIG. 1 depicts the PAWG circuit.
Figure 2:
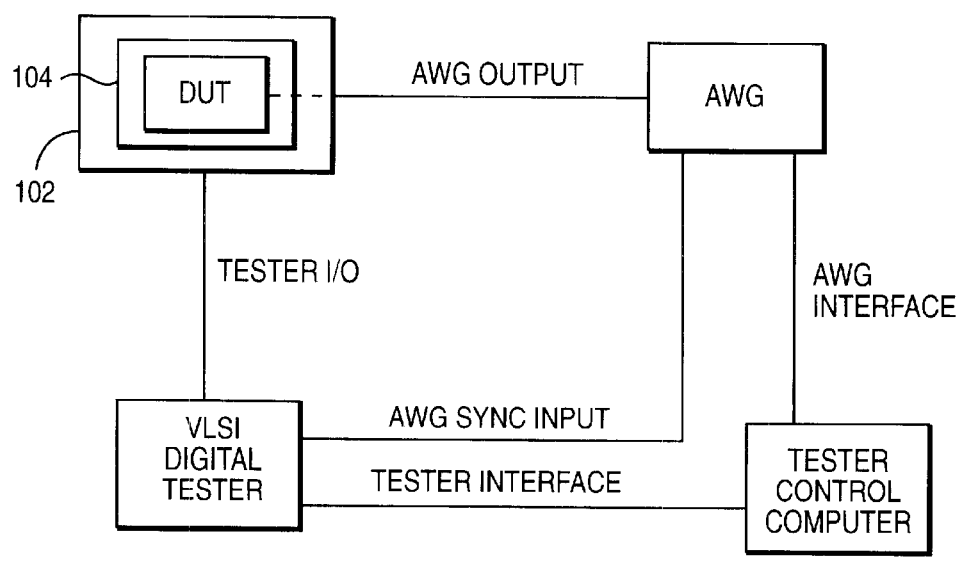
FIG. 2 depicts the connection of an AWG to both a VLSI Digital Tester and a DUT.

Once at least two datapoints are read, a determination can be made as to the slope of the curve described by the datapoints can be made (Step 308). Datapoints are processed until 2 end points to the RC curve are found (the slope of the curve changes). The beginning of the slope is referred to in the software code as FNR. If a change of slope has occurred or the voltage was decreasing and is now increasing or vice versa, an endpoint of the present curve is indicated. The curve (or RC curve) is the capacitive charge or decay curve which is an arc when voltage is plotted against time). The shape (or angle) of the RC curve is dependent on many factors including the RC constants in the software:

RCa is the resistance/capacitance time constant for $R_1$–$R_n$ and $C_1$ of FIG. 1.

RCb is the resistance/capacitance time constant for $R_1$ and $C_5$ of FIG. 1.

res is the resolution of the waveform. That is, the minimum time space between changes in the waveform. In the presently preferred embodiment, the resolution of the waveform is 5 ns.

RPV is the resolution per vector. In a 10 ns time period, RPV is 2. That is, there are 2 changes per period.

The goal of this section of the PAWG software is to find the datapoints of the arc that make up the end points of the curve which will be generated as analog test stimuli. Once end points to the curve are found, a curve fit routine is called (Step 310).

Curve Fit Routine

If the curve fit routine is called because of a change in direction, the routine receives a 0. If the curve fit routine is called because of a change in slope, the routine receives a 1.

The routine first calculates the change in voltage (ΔV) and the change in time (ΔT) values based on the datapoints found as the two end points of the RC curve (Step 312). ΔV is the difference between the voltage applied at the beginning of the curve and what voltage is desired at the end of the curve. ΔT is the difference in time for the beginning of the curve to the end of the curve, rounded to the nearest resolution time period (5 ns in the presently preferred embodiment). That is ΔT=res*time.

The curve fit function calculates an ideal Vapp that will achieve the endpoint voltage desired (Step 314). VAend is the voltage that should be applied at the endpoint of the curve. Vapp then is a function of the voltage to the resistor divider ($R_1$–$R_n$) vs. RCa. That is, the function calculates the initial voltage needed at $R_1$–$R_n$ to achieve ΔV within ΔT with a capacitance of $C_1$. The formula used in the presently preferred embodiment is:

$$Vapp = \Delta V/(1-\exp(-1*\Delta T/RCa)) + VAnow$$

where:

Vapp is the voltage to be applied to $R_1$–$R_n$ of the resistor divider; and

VAnow is the voltage that would result at $C_1$.

VAnow is tracked as the time and voltage values change over the datapoints of the curve. The result of the calculation determines how many of resistors $R_1$–$R_n$ to drive high (+1v) and how many to drive low (−1v) (Step 316).

The voltage that would be obtained by driving the resistor divider in this manner is calculated as VAnew and the voltage expected at the end of the curve is predicted upon the basis of previous calculations (the number of resistors driven high and low vs. the voltage at the beginning of the curve) (Steps 318 and 320). If VAnew is not equal to VAend, the number of resistors driven high must be adjusted (Step 322). If VAnew is lower than the ideal Vapp then the pattern data (data indicating how many resistors to drive high and low) is adjusted to drive more resistors high (Step 324). If the voltage that would be obtained is higher than the ideal VAend then the pattern data is adjusted to drive more resistors low (Step 324). This adjustment is made only to a few datapoints at the beginning of the curve (Step 324). This small adjustment window is due to an acceleration factor on C1. That is, for significant changes on the resistor divider there may initially be little change at $C_1$. However, applying excessively high or low voltages at the beginning of the curve can grossly exaggerate the waveform output by the end of the curve. Therefore, in the presently preferred embodiment, only the first 20 ns of the resolution of the curve are adjusted. This timing is sufficient to effect the curve without distorting the waveform.

In the software, the adjustment of Vapp is an iterative process. The iterative process completes when the adjustments bring the VAnew value above VAend (for the case in which the voltage obtained is lower than the ideal Vapp) or below VAend (for the case in which the voltage obtained is higher than the ideal Vapp) (Step 322).

Once an adjusted and a non-adjusted curve are obtained, a comparison is made to determine which curve offers a better fit based on the incoming datapoints, the original prediction or the prediction as adjusted through the iterative process described above (Step 326). The information (a pattern set) describing the better fit (number of resistors to drive high and drive duration) is then saved into an array.

Pattern Generation Routine

After all datapoints describing the waveform of a particular curve are read and the curve fit function has completed for each change of direction or slope a file is created (the "Expected" file 336) which will contain the time and voltage data computed in the curve fit function. The data written conforms to the resolution of the software driver. The expected file is used as an accuracy check by overlaying a plot of the input time-voltage pairs with a plot of the expected time-voltage pairs.

The pattern array result determined by the curve fit function is converted to the voltage value to be applied to the resistor divider at each step of the timing resolution for the given curve (Step 328). The timing value and voltage value are written to the Expected file (Step 330). The voltage value indicates the new voltage to be applied at each step in the timing resolution.

Vector data which conforms to the input needed for the particular VLSI tester to be used must now be created. Vector data is determined based on the pattern result of the curve fit routine. In the presently preferred embodiment, the software drives a Multi-Level Tone 3 (mlt3) waveform VLSI digital tester. mlt3 is a waveform used for ethernet interfacing with a computer. In mlt3 testing the waveform used is distorted as though it has travelled through 100 meters of 10/100 T cabling. Testing of the DUT takes place to ensure that it can accurate ly read the signal. This digital tester uses a V-series MZDI circuit which must be programmed on a vector basis. The vector duration for the V-series MZDI is 10 ns. Therefore, 2 steps (of 5 ns each) fit into each vector. Programming data for the vector data is based on the current data (number of resistors to drive high) and the previous data (Step 332). A set number is assigned on this basis and saved to a second file (the "Pattern" file 338) (Step 334). The MZDI circuit also requires another file for programming which is constant (does not change despite the input vector sets). The input sets are specific to the test generator used. Software code has also been generated to drive a Polaris VLSI digital tester.

Waveform Generation

FIG. 1 depicts the PAWG circuit. The analog test stimulus is created by the PAWG circuit receiving input from a VLSI digital tester. The Pattern file created by the PAWG software is used as input to a VLSI digital tester. The vectors described in the Pattern file are read by the VLSI digital tester. In turn, the digital tester drives the resistor divider inputs ($R_1$–$R_n$) to the circuit. In the presently preferred embodiment, the resistor divider consists of 8 resistors. A change in the number of resistors of the divider can increase or decrease the voltage resolution of the resulting curve. The software is written to produce vectors for driving an 8 resistor divider. Therefore, any change in the number of resistors used in the resistor divider requires a change in the software.

Capacitor $C_1$ is connected to the output of the resistor divider and tied to ground. The rate of rise or fall in voltage is determined by $C_1$ (or the RCa constant). Capacitor $C_1$ impedes a rapid change in voltage to transistor $T_1$. Transistor $T_1$ buffers the RC circuit from the DUT to prevent the input impedance of the DUT from affecting its time constant. $R_s$ and $C_s$ are used if a secondary, lower frequency slope is desired. A secondary, lower frequency slope is usually employed when generating mlt3 waveforms. In mlt3 waveforms, a transmission line affect known as "base line wander" causes a low frequency triangle wave to be modulated with the high frequency waveform of the data transmission. As a result of this modulation, the center reference line, or base line, of the already distorted high frequency waveform received by the DUT slopes slowly upward then downward. To verify that the DUT can compensate for the base line wander $R_s$ and $C_s$ are used to cause the base line of the high frequency waveform to slope upward, simulating one half cycle of base line wander. In an alterna tive embodiment, if simulation of a full cycle of base line wander is desired, then $C_s$ would be terminated to a tester driver instead of ground and the driver would be switched from a high voltage to a low voltage, or vise versa, whenever a change in slope is desired. Capacitor $C_1$ serves to integrate the discrete time inputs (datapoints of initial file and input to resistors of the resistor divider) resulting in a discrete time to continuous time conversion of the simulated waveform. The resulting output of the circuit is an analog output corrected for the resolution of the device under test.

Code

The following code provides a sample implementation of the disclosed technique. Of course, alternate implementations are well within the abilities of one skilled in the art and this code is therefore presented only as an example of how these functions may be accom plished and is not meant to limit the disclosed technique in scope or embodiment in any way.

```
# V-Series pattern generator for mlt3 waveforms
# - reads time/voltage pair data representing the desired mlt3
waveform and
# generates a V-Series tester pattern set to drive the PAWG.
# - also generates time/voltage pair data of the expected PAWG
waveform

BEGIN { # this block is executed once at the beginning of program
execution
#   set flags, counters, and starting voltage
    Checkslope = 0; ProcessLine = 0; x = 1; p = 0;
    DrvHi = 1; DrvLo = -1;
    Vnow = 0; VAnow = 0; MinRatio = 1; Vnew = 0;
#   set RC value calculated from measured slopes
    RCa = 34.09e-9; RCb = 4.88488e-6;
#   set resolution to one half of the test period (resolution on
V-Series)
    res = 5e-9;
#   set resolution steps per vector
    RPV = 2;
}

# All lines from here to "END" are executed as each new line is read
from the
# input file except where otherwise noted

{ # read a data point
    t[x] =$1; # store time datum in array t
    v[x] =$2; # store voltage datum in array v
    if (FNR == 1) {
        FirstT = t [x] ;
        FirstV = v[x] ;
        SaveT = t[x] }

# determine if voltage is increasing or decreasing.

if (x > 1) {
    if (v[x] > v[x-1]) {rising = 1} else {rising = 0}}

# if voltage is now increasing but had been drecreasing,
# then previous point read is at end of a RC curve.
if ((ProcessLine == 0) && (x > 2)) {
    if ((rising == 1) && (v[x -1] < v[x-2])) {
        Endpoint = x - 1;
        SaveT = t[x];
        SaveV = v[x];
        ProcessLine = 1;
        CurveFit(0)}} # function CurveFit is located at bottom of this
file

# if voltage is now drecreasing but had been increasing,
# then previous point read is at end of a RC curve.
```

```

if ((ProcessLine == 0) && (x > 2)) {
   if ((rising == 0) && (v[x-1] > v[x-2])) {
      Endpoint = x - 1;
      SaveT = t[x];
      SaveV = v[x];
      ProcessLine = 1
      CurveFit(0)}} # function CurveFit is located at bottom of this
file

# if |slope| at current point is larger than |slope| at previous
point,
# then previous point is at end of a RC curve.
# formulas depend on consistent time steps in input file.
# do not check in first 5nS of each curve because nawk exp function
# resolution will casue a divide by zero error later in routine.

if ((ProcessLine == 0) && ((t[x]- SaveT) > 5e-9)) {
   d1 = v[x-1]- v[x-2];
   d2 = v[x]- v[x-1];
   if (d1 != 0) {Ratio = d2/d1} else {Ratio = 0}
   if (CheckSlope) {
      if (Ratio > OldRatio) {UpSlope = 1} # at corner if ratio > old
ratio
      else {
         if ((UpSlope) && (Ratio > MinRatio)) {   # one step past
corner
            Endpoint = x - 1;
            SaveT = t[x];
            SaveV = v[x];
            ProcessLine = 1;
            CurveFit(1)}   # function CurveFit is located at bottom of
this file
         UpSlope = 0}}
      OldRatio = Ratio;
      Checkslope = 1}

# if not at end of curve, then increment array index and read next
datapoint.

if (ProcessLine == 0) {x++}

# if at end point of curve, then process the curve.

if (ProcessLine == 1) {
   ProcessLine = 0}}

# "END" block is executed once after the last data point has been
read

END {            # end of main body, begin pattern generation
routine

#           PATTERN GENERATION ROUTINE

# process last line segment.

EndPoint = x - 1;
CurveFit (0);
VAnow=0;

#    derive output filenames from input file name.

   F = FILENAME;
   F = substr(F,1,match(F, "[.]") -1);
   PatFile = F ".vvs";
   ExpectFile = F ".exp";

# print first datapoint to ExpectFile

   print (FirstT, FirstV) >ExpectFile;

# loop through pattern array
   for (x=1;x<=p;x++) {

# calculate output voltage, Vnew, at each step of timing resolution.
# print time/voltage to ExpectFile.

   if (pattern[x] == 0) {Vapp = DrvLo}
   if (pattern[x] == 1) {Vapp = (0.75*DrvLo)}
   if (pattern[x] == 2) {Vapp = (0.5*DrvLo)}
   if (pattern[x] == 3) {Vapp = (0.25*DrvLo)}
   if (pattern[x] == 4) {Vapp = 0}
   if (pattern[x] == 5) {Vapp = (0.25*DrvHi)}
   if (pattern[x] == 6) {Vapp = (0.5*DrvHi)}
   if (pattern[x] == 7) {Vapp = (0.75*DrvHi)}
   if (pattern[x] == 8) {Vapp = DrvHi}
   VCa = (Vapp - VAnow) * (1 - exp(-1 * res/RCa));
   VAnew = VCa + VAnow;
   VCb = VAnow * (1 - exp(-1 * res/RCb));
   Vnew = Vnew + VCa - VCb;
   print (x * res + FirstT, Vnew) >ExpectFile;
   VAnow = VAnew;

# determine if pattern array index is at begining of a new vector.
# (divide the index - 1 by the resolution steps per vector, RPV.
)
# (if the real result is approximately equal to the integer part of
)
# (the result then it is at the beginning of the next vector.
)

   Real = (x - 1)/RPV;
   Max = int(Real) + 0.05;
   Min = int(Real) - 0.05;
   if ((Real <= Max) && (Real >= Min)) {NewVec = 1}
   else {NewVec = 0}

# if NewVec then generate vector data

   if (NewVec == 1) {
      if (pattern[x] == 0) {Data = "0000000000"}
      if (pattern[x] == 1) {Data = "1000000000"}
      if (pattern[x] == 2) {Data = "1100000000"}
      if (pattern[x] == 3) {Data = "1110000000"}
      if (pattern[x] == 4) {Data = "1111000000"}
      if (pattern[x] == 5) {Data = "1111100000"}
      if (pattern[x] == 6) {Data = "1111110000"}
      if (pattern[x] == 7) {Data = "1111111000"}
      if (pattern[x] == 6) {Data = "1111111100"}}

# if not NewVec then determine if the data should switch at next res
step
# and assign V-Series MZDI set number based on the current and
previous
data.

   if (Newvec == 0) {
      if (x == 1) {LastHigh = pattern[1]}
      if (LastHigh == pattern[x]) {MZDI = "   ( 1, 1) ["}
      else {
         if ((pattern[x] == 0) && (LastHigh == 1)) {MZDI = "   ( 1, 2) ["}
         if ((pattern[x] == 1) && (LastHigh == 2)) {MZDI = "   ( 1, 3) ["}
         if ((pattern[x] == 2) && (LastHigh == 3)) {MZDI = "   ( 1, 4) ["}
         if ((pattern[x] == 3) && (LastHigh == 4)) {MZDI = "   ( 1, 5) ["}
         if ((pattern[x] == 4) && (LastHigh == 5)) {MZDI = "   ( 1, 6) ["}
         if ((pattern[x] == 5) && (LastHigh == 6)) {MZDI = "   ( 1, 7) ["}
         if ((pattern[x] == 6) && (LastHigh == 7)) {MZDI = "   ( 1, 8) ["}
         if ((pattern[x] == 7) && (LastHigh == 8)) {MZDI = "   ( 1, 9) ["}
         if ((pattern[x] == 1) && (LastHigh == 0)) {MZDI = "   ( 1, 2) ["}
         if ((pattern[x] == 2) && (LastHigh == 1)) {MZDI = "   ( 1, 3) ["}
         if ((pattern[x] == 3) && (LastHigh == 2)) {MZDI = "   ( 1, 4) ["}
```

-continued

```
   if ((pattern[x] == 4) && (LastHigh == 3)) {MZDI = " ( 1,
5) ["}
   if ((pattern[x] == 5) && (LastHigh == 4)) {MZDI = " ( 1,
6) ["}
   if ((pattern[x] == 6) && (LastHigh == 5)) {MZDI = " ( 1,
7) ["}
   if ((pattern[x] == 7) && (LastHigh == 6)) {MZDI = " ( 1,
8) ["}
   if ((pattern[x] == 8) && (LastHigh == 7)) {MZDI = " ( 1,
9) ["}
   if ((pattern[x] == 0) && (LastHigh == 2)) {MZDI = " ( 1,
10) ["}
   if ((pattern[x] == 1) && (LastHigh == 3)) {MZDI = " ( 1,
11) ["}
   if ((pattern[x] == 2) && (LastHigh == 4)) {MZDI = " ( 1,
12) ["}
   if ((pattern[x] == 3) && (LastHigh == 5)) {MZDI = " ( 1,
13) ["}
   if ((pattern[x] == 4) && (LastHigh == 6)) {MZDI = " ( 1,
14) ["}
   if ((pattern[x] == 5) && (LastHigh == 7)) {MZDI = " ( 1,
15) ["}
   if ((pattern[x] == 6) && (LastHigh == 8)) {MZDI = " ( 1,
16) ["}
   if ((pattern[x] == 2) && (LastHigh == 0)) {MZDI = " ( 1,
10) ["}
   if ((pattern[x] == 3) && (LastHigh == 1)) {MZDI = " ( 1,
11) ["}
   if ((pattern[x] == 4) && (LastHigh == 2)) {MZDI = " ( 1,
12) ["}
   if ((pattern[x] == 5) && (LastHigh == 3)) {MZDI = " ( 1,
13) ["}
   if ((pattern[x] == 6) && (LastHigh == 4)) {MZDI = " ( 1,
14) ["}
   if ((pattern[x] == 7) && (LastHigh == 5)) {MZDI = " ( 1,
15) ["}
   if ((pattern[x] == 8) && (LastHigh == 6)) {MZDI = " ( 1,
16) ["}
   if ((pattern[x] == 0) && (LastHigh == 3)) {MZDI = " ( 1,
17) ["}
   if ((pattern[x] == 1) && (LastHigh == 4)) {MZDI = " ( 1,
18) ["}
   if ((pattern[x] == 2) && (LastHigh == 5)) {MZDI = " ( 1,
19) ["}
   if ((pattern[x] == 3) && (LastHigh == 6)) {MZDI = " ( 1,
20) ["}
   if ((pattern[x] == 4) && (LastHigh == 7)) {MZDI = " ( 1,
21) ["}
   if ((pattern[x] == 5) && (LastHigh == 9)) {MZDI = " ( 1,
22) ["}
   if ((pattern[x] == 3) && (LastHigh == 0)) {MZDI = " ( 1,
17) ["}
   if ((pattern[x] == 4) && (LastHigh == 1)) {MZDI = " ( 1,
18) ["}
   if ((pattern[x] == 5) && (LastHigh == 2)) {MZDI = " ( 1,
19) ["}
   if ((pattern[x] == 6) && (LastHigh == 3)) {MZDI = " ( 1,
20) ["}
   if ((pattern[x] == 7) && (LastHigh == 4)) {MZDI = " ( 1,
21) ["}
   if ((pattern[x] == 8) && (LastHigh == 5)) {MZDI = " ( 1,
22) ["}
   if ((pattern[x] == 0) && (LastHigh == 4)) {MZDI = " ( 1,
23) ["}
   if ((pattern[x] == 1) && (LastHigh == 5)) {MZDI = " ( 1,
24) ["}
   if ((pattern[x] == 2) && (LastHigh == 6)) {MZDI = " ( 1,
25) ["}
   if ((pattern[x] == 3) && (LastHigh == 7)) {MZDI = " ( 1,
26) ["}
   if ((pattern[x] == 4) && (LastHigh == 8)) {MZDI = " ( 1,
27) ["}
   if ((pattern[x] == 4) && (LastHigh == 0)) {MZDI = " ( 1,
23) ["}
   if ((pattern[x] == 5) && (LastHigh == 1)) {MZDI = " ( 1,
24) ["}
   if ((pattern[x] == 6) && (LastHigh == 2)) {MZDI = " ( 1,
25) ["}
   if ((pattern[x] == 7) && (LastHigh == 3)) {MZDI = " ( 1,
26) ["}
   if ((pattern[x] == 8) && (LastHigh == 4)) {MZDI = " ( 1,
27) ["}
   if ((pattern[x] == 0) && (LastHigh == 5)) {MZDI = " ( 1,
28) ["}
   if ((pattern[x] == 1) && (LastHigh == 6)) {MZDI = " ( 1,
29) ["}
   if ((pattern[x] == 2) && (LastHigh == 7)) {MZDI = " ( 1,
30) ["}
   if ((pattern[x] == 3) && (LastHigh == 8)) {MZDI = " ( 1,
31) ["}
   if ((pattern[x] == 5) && (LastHigh == 0)) {MZDI = " ( 1,
28) ["}
   if ((pattern[x] == 6) && (LastHigh == 1)) {MZDI = " ( 1,
29) ["}
   if ((pattern[x] == 7) && (LastHigh == 2)) {MZDI = " ( 1,
30) ["}
   if ((pattern[x] == 8) && (LastHigh == 3)) {MZDI = " ( 1,
31) ["}
   if ((pattern[x] == 0) && (LastHigh == 6)) {MZDI = " ( 1,
32) ["}
   if ((pattern[x] == 1) && (LastHigh == 7)) {MZDI = " ( 1,
33) ["}
   if ((pattern[x] == 2) && (LastHigh == 8)) {MZDI = " ( 1,
34) ["}
   if ((pattern[x] == 6) && (LastHigh == 0)) {MZDI = " ( 1,
32) ["}
   if ((pattern[x] == 7) && (LastHigh == 1)) {MZDI = " ( 1,
33) ["}
   if ((pattern[x] == 8) && (LastHigh == 2)) {MZDI = " ( 1,
34) ["}
   if ((pattern[x] == 0) && (LastHigh == 7)) {MZDI = " ( 1,
35) ["}
   if ((pattern[x] == 1) && (LastHigh == 8)) {MZDI = " ( 1,
36) ["}
   if ((pattern[x] == 7) && (LastHigh == 0)) {MZDI = " ( 1,
35) ["}
   if ((pattern[x] == 8) && (LastHigh == 1)) {MZDI = " ( 1,
36) ["}
   if ((pattern[x] == 0) && (LastHigh == 8)) {MZDI = " ( 1,
37) ["}
   if ((pattern[x] == 8) && (LastHigh == 0)) {MZDI = " ( 1,
37) ["}}

#    print the vector to PatFile

     print MZDI Data ";" >PatFile}
   LastHigh = pattern[x] }}           # end of pattern generation
routine

#                   CURVE FITTING ROUTINE

# following function finds applied voltage for each resolution step
# to give best fit of output to intended curve.

function CurveFit (SlopeChange) {

# calculate delta voltage, dV, and delta time, dT.
# adjust dT to resolution of tester.

   CheckSlope = 0;
   VAend = v[EndPoint];
   dV = VAend − VAnow;
   dT = t[EndPoint]− t[1];
   time = int(dT / res);
   d1 = dT − (time * res);
   d2 = (res * (time + 1)) − dT;
   if (d1 < 0) {d1 = −1 * d1}
   if (d2 < 0) {d2 = −1 * d2}
   if (d1 > d2) {time++}
   dT = res * time;

# calculate ideal applied voltage, Vapp, then adjust to
# resolution of voltage devider. set NumHi to number of high inputs
```

-continued

```
# to get desired voltage. copy NumHi to pattern array.

if (dT == 0) {print $1, $2}
    Vapp = dV / (1 - exp(-1 * dT/RCa)) + VAnow;
    if (Vapp <= (0.875*DrvLo))          {Vapp = DrvLo;
NumHi
= 0}
    if ((Vapp > (0.875*DrvLo)) && (Vapp <=(0.625*DrvLo)))
                                        {Vapp = (0.75*DrvLo);
NumHi
= 1}
    if ((Vapp > (0.625*DrvLo)) && (Vapp <= (0.375*DrvLo)))
                                        {Vapp = (0.5*DrvLo);
NumHi
= 2}
    if ((Vapp > (0.375*DrvLo)) && (Vapp <= (0.125*DrvLo)))
                                        {Vapp = (0.25*DrvLo);
NumHi
= 3}
    if ((Vapp > (0.125*DrvLo)) && (Vapp <= (0.125*DrvHi)))
                                        {Vapp = 0;
NumHi
= 4}
    if ((Vapp > (0.125*DrvHi)) && (Vapp <= (0.375*DrvHi)))
                                        {Vapp = (0.25*DrvHi);
NumHi
= 5}
    if ((Vapp > (0.375*DrvHi)) && (Vapp <= (0.625*DrvHi)))
                                        {Vapp = (0.5*DrvHi);
NumHi
= 6}
    if ((Vapp > (0.625*DrvHi)) && (Vapp <= (0.875*DrvHi)))
                                        {Vapp = (0.75*DrvHi);
NumHi
= 7}
    if (Vapp > (0.875*DrvHi))           {Vapp = DrvHi;
NumHi
= 8}
    for (y=1;y<=time;y++) {pattern[p + y] = NumHi}

# calculate the new first stage voltage, VAnew, expected with Vapp
after dT.

    VCa = (Vapp - VAnow) * (1 - exp(-1 * dT/RCa));
    VAnew = VCa + VAnow;

# if VAnew is lower than required voltage, VAend, then attempt to
adjust
# pattern data to improve fit.

    increment = 0;
    if ((VAnew < VAend) && (NumHi < 8)) {increment = 1}
    if (increment) {
       y = 1;
       NotDone = 1;

#    only first 20nS can be adjusted (avoids bumps in curve)

       while (((y*res)<=2oe-9) && (NotDone)) {
          V1 = (Vapp + .25 - VAnow) * (1 - exp(-1 * (y * res)/RCa));
          V2 = (Vapp - (VAnow + V1)) * (1 - exp(-1 *
((time-y)*res) /RCa));

#    if still low after predicted adjustment then adjust and repeat
process

          if ((V1 + V2 + VAnow) < VAend) {pattern[p + y]++;
             VAnew = V1 +
V2 +
VAnow}

#    else determine if adjusted or not adjusted is better fit
          else {
             NotDone = 0;
             d1 = VAend - VAnew;
             d2 = (V1 + V2 + VAnow) - VAend;
             if (d1 < 0) {d1 =-1 * d1}
             if (d2 < 0) {d2 =-1 * d2}
             if (d1 > d2) {pattern[p + y]++;VAnew = V1 + V2 + VAnow}}
```

-continued

```
          y++}}

# if VAnew is higher than required voltage, VAend, then attempt to
adjust
# pattern data to improve fit.

    decrement = 0;
    if ((VAnew > VAend) && (NumHi > 0)) {decrement = 1}
    if ((decrement == 1) && (increment == )){
       y = 1;
       NotDone = 1;

#    only first 2OnS can be adjusted (avoids bumps in curve)

       while (((y*res) <=2oe-9) && (NotDone)) {
          V1 = (Vapp - .25 - VAnow) * (1 - exp(-1 * (y * res)/RCa));
          V2 = (Vapp - (VAnow + V1)) * (1 - exp(-1 *
((time-y) * res) /RCa));

#    if still high after predicted adjustment then adjust and repeat
process
#    if ((V1 + V2 + VAnow) > VAend) {pattern[p + y]--;
             VAnew = V1 +
V2 +
VAnow}

#    else determine if adjusted or not adjusted is better fit

          else {
             NotDone = 0;
             d1 = VAnew - VAend;
             d2 = VAend - (Vi + V2 + VAnow);
             if (d1 < 0) {d1 = -1 * d1}
             if (d2 < 0) {d2 = -1 * d2}
             if (d1 > d2) {pattern[p + y]--; VAnew = V1 + V2 + VAnow}}
          y++}}

# set variables for reading and processing next curve.

    p = p + time;
    t[1] = SaveT;
    v[1] = SaveV;
    x = 2;
    VAnow = VAnew} # end of CurveFit function.
```

According to a disclosed class of innovative embodiments, there is provided: a method for generating arbitrary waveforms, comprising the actions of: receiving a set of datapoints which describes a waveform to be generated; generating a set of vectors from said set of datapoints which drives a digital tester unit; and driving said digital tester unit with said set of vectors; whereby said digital test unit drives the resistors of a resistor divider according to said set of vectors to produce a test stimulus substantially similar to said waveform which is applied to a device under test.

According to another disclosed class of innovative embodiments, there is provided: a method for generating arbitrary waveforms, comprising the actions of: receiving a set of datapoints which describes a waveform to be generated; identifying slope or voltage changes in said set of datapoints as end points; calculating voltages which will result in said end points; determining the number of resistors of a pseudo-arbitrary waveform generator circuit to drive high based on the results from said calculating step; converting the result of said determining step to voltage values to be applied to said resistors; and generating a set of vectors from the result of said converting step which can drive a digital tester unit; whereby said digital test unit drives the resistors of said circuit according to said set of vectors to produce a test stimulus substantially similar to said waveform which is applied to a device under test.

According to another disclosed class of innovative embodiments, there is provided: a system for generating arbitrary waveforms, comprising: a set of datapoints which describes a waveform to be generated; a computer system comprising software which receives said set of datapoints and generates a set of vectors from said set of datapoints which drives a digital tester unit; a digital tester unit connected to receive said set of vectors; and a circuit connected to be driven by the output of said digital tester unit and produce a test stimulus substantially similar to said waveform which is applied to a device under test.

According to another disclosed class of innovative embodiments, there is provided: a system for generating arbitrary waveforms, comprising: a set of datapoints which describes a waveform to be generated; a computer system configured to receive said set of datapoints and generates a set of vectors from said set of datapoints which drives a digital tester unit; a digital tester unit connected to receive said set of vectors; and a circuit connected to be driven by the output of said digital tester unit and produce a test stimulus substantially similar to said waveform which is applied to a device under test.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The presently preferred embodiment is described as software capable of driving and a circuit having a resistor divider of 8 resistors. However, the resistor divider can be constructed of a greater or fewer number of resistors and the software can be written accordingly.

The presently preferred embodiment is described as software driving the resistors of a resistor divider at ±1 volt. However, the voltages determining high and low can be adjusted depending on the type of test stimuli desired.

The presently preferred embodiment describes software routines for creating circuit drivers for both V-series and Polaris type test generators. However, the software for both is similar and the code can be easily modified to create driver files for other types of testers which can in turn drive the described circuit. Any VLSI tester that does not include a self-contained high-speed AWG, including such testers as the Teradyne J-97x series can be used with the PAWG described.

What is claimed is:

1. A method for generating arbitrary waveforms, comprising the actions of:
   receiving a set of datapoints which describes a waveform to be generated;
   generating a set of vectors from said set of datapoints which drives a digital test unit; and
   driving said digital test unit with said set of vectors;
   whereby said digital test unit drives resistors of a resistor divider according to said set of vectors to produce a test stimulus substantially similar to said waveform which is applied to a device under test.

2. The method of claim 1 wherein said set of datapoints is generated in a test simulator.

3. The method of claim 1 wherein said generating action is performed by software.

4. The method of claim 1 wherein said set of datapoints is generated by digitizing a desired waveform.

5. The method of claim 1 wherein said set of vectors is dependent on the resolution of said test stimulus.

6. The method of claim 1 wherein a capacitor connected to said resistor divider converts the discrete time output of said resistor divider to a continuous time output.

7. A method for generating arbitrary waveforms, comprising the actions of:
   receiving a set of datapoints which describes a waveform to be generated;
   identifying slope or voltage changes in said set of datapoints as end points;
   calculating voltages which will result in said end points;
   determining a number of resistors of a pseudo-arbitrary waveform generator circuit to drive high based on the results from said calculating action;
   converting the result of said determining action to voltage values to be applied to said number of resistors; and
   generating a set of vectors from the result of said converting action which can drive a digital test unit;
   whereby said digital test unit drives said number of resistors of said pseudo-arbitrary waveform generator circuit according to said set of vectors to produce a test stimulus substantially similar to said waveform which is applied to a device under test.

8. The method of claim 7 wherein said set of datapoints is generated in a test simulator.

9. The method of claim 7 wherein said actions are performed by software.

10. The method of claim 7 wherein said calculating action is performed for each set of said end points.

11. The method of claim 7 wherein said determining action further comprises the steps of calculating an expected voltage from driving said determined number of resistors high, predicting an expected voltage after a given time, adjusting said number of resistors to drive high based on said predicted expected voltage, adjusting said number of resistors to drive high and repeating said further actions until desired accuracy is achieved.

12. The method of claim 7 wherein said set of vectors is dependent on the resolution of said test stimulus.

13. A system for generating arbitrary waveforms, comprising:
   a set of datapoints which describes a waveform to be generated;
   a computer system comprising software which receives said set of datapoints and generates a set of vectors from said set of datapoints which drives a digital test unit;
   said digital test unit connected to said computer system to receive said set of vectors; and
   a circuit connected to be driven by the output of said digital test unit and produce a test stimulus substantially similar to said waveform which is applied to a device under test.

14. The system of claim 13 wherein said set of datapoints is generated in a test simulator.

15. The system of claim 13 wherein said set of datapoints is generated by digitizing a desired waveform.

16. The system of claim 13 wherein a capacitor connected to a resistor divider converts the discrete time output of said resistor divider to a continuous time output.

17. A system for generating arbitrary waveforms, comprising:
   a set of datapoints which describes a waveform to be generated;
   a computer system configured to receive said set of datapoints and generate a set of vectors from said set of datapoints which drives a digital test unit;
   said digital test unit connected to said computer system to receive said set of vectors; and a circuit connected to be driven by the output of said digital test unit and produce a test stimulus substantially similar to said waveform which is applied to a device under test.

18. The system of claim 17 wherein said computer system comprises software which receives said set of datapoints.

19. The system of claim 17 wherein said set of datapoints is generated by digitizing a desired waveform.

20. The system of claim 17 wherein a capacitor connected to a resistor divider converts the discrete time output of said resistor divider to a continuous time output.

* * * * *